United States Patent
Lammel et al.

(10) Patent No.: US 8,492,850 B2
(45) Date of Patent: Jul. 23, 2013

(54) METHOD FOR PRODUCING A SILICON SUBSTRATE HAVING MODIFIED SURFACE PROPERTIES AND A SILICON SUBSTRATE OF SAID TYPE

(75) Inventors: Gerhard Lammel, Tuebingen (DE); Hubert Benzel, Pliezhausen (DE); Matthias Illing, Palo Alto, CA (US); Franz Laermer, Weil der Stadt (DE); Silvia Kronmueller, Schwaikheim (DE); Paul Farber, Stuttgart (DE); Simon Armbruster, Gomaringen (DE); Ralf Reichenbach, Esslingen (DE); Christoph Schelling, Stuttgart (DE); Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 577 days.

(21) Appl. No.: 12/308,200

(22) PCT Filed: Apr. 27, 2007

(86) PCT No.: PCT/EP2007/054172
§ 371 (c)(1),
(2), (4) Date: Sep. 23, 2009

(87) PCT Pub. No.: WO2007/147670
PCT Pub. Date: Dec. 27, 2007

(65) Prior Publication Data
US 2010/0035068 A1    Feb. 11, 2010

(30) Foreign Application Priority Data
Jun. 23, 2006  (DE) .......................... 10 2006 028 921

(51) Int. Cl.
*H01L 27/088* (2006.01)
(52) U.S. Cl.
USPC ........................................................ 257/396

(58) Field of Classification Search
USPC ............ 257/300, 396; 438/3, 424; 428/317.9; 356/244
See application file for complete search history.

(56) References Cited

U.S. PATENT DOCUMENTS 5,137,868 A * 8/1992 Yamazaki .................... 505/329
5,206,523 A * 4/1993 Goesele et al. ................. 257/16
(Continued)

FOREIGN PATENT DOCUMENTS
JP  6-268260   9/1994
JP  7-254729  10/1995
(Continued)

OTHER PUBLICATIONS

Henley W et al : "Infrared photoluminescence from ER doped porous Si" Journal of Applied Physics, America Institute of Physics. New York, US, vol. 87, No. 11, Jun. 1, 2000, pp. 7848-7852, XP012049168, ISS : 0021-8979, II Experiment.

(Continued)

*Primary Examiner* — Nathan Ha
(74) *Attorney, Agent, or Firm* — Kenyon & Kenyon LLP

(57) ABSTRACT

A method for producing a silicon substrate, including the steps of providing a silicon substrate having an essentially planar silicon surface, producing a porous silicon surface having a plurality of pores, in particular having macropores and/or mesopores and/or nanopores, applying a filling material that is to be inserted into the silicon, which has a diameter that is less than a diameter of the pores, inserting the filling material into the pores and removing the excess filling material form the silicon surface, if necessary, and tempering the silicon substrate that is furnished with the filling material that has been filled into the pores, at a temperature between ca. 1000° C. and ca. 1400° C., in order to close the generated pores again and to enclose the filling material.

5 Claims, 1 Drawing Sheet

U.S. PATENT DOCUMENTS

| | | | |
|---|---|---|---|
| 5,670,411 A * | 9/1997 | Yonehara et al. | 438/459 |
| 5,914,183 A * | 6/1999 | Canham | 428/312.6 |
| 6,027,796 A * | 2/2000 | Kondoh et al. | 428/312.8 |
| 6,107,213 A * | 8/2000 | Tayanaka | 438/762 |
| 6,114,032 A * | 9/2000 | Kelber | 428/336 |
| 6,720,105 B2 * | 4/2004 | Ohlsen et al. | 429/524 |
| 6,824,866 B1 * | 11/2004 | Glazer et al. | 428/317.9 |
| 7,198,864 B2 * | 4/2007 | Ohlsen | 429/532 |
| 7,968,273 B2 * | 6/2011 | Chen et al. | 430/311 |
| 8,003,408 B2 * | 8/2011 | Zhang et al. | 436/525 |
| 8,012,771 B2 * | 9/2011 | Pullini et al. | 438/3 |
| 2002/0048703 A1 * | 4/2002 | Ohlsen et al. | 429/44 |
| 2004/0092396 A1 * | 5/2004 | Glazer et al. | 502/439 |
| 2004/0171143 A1 * | 9/2004 | Chin et al. | 435/287.2 |
| 2005/0263754 A1 | 12/2005 | Komiyama et al. | |
| 2006/0215154 A1 * | 9/2006 | Chan et al. | 356/244 |
| 2006/0216836 A1 * | 9/2006 | Pullini et al. | 438/3 |
| 2006/0249070 A1 * | 11/2006 | Morrison et al. | 117/2 |
| 2006/0263025 A1 * | 11/2006 | Sugita et al. | 385/129 |
| 2007/0035386 A1 * | 2/2007 | Pullini et al. | 340/442 |
| 2007/0111468 A1 * | 5/2007 | Xie et al. | 438/424 |
| 2007/0202304 A1 * | 8/2007 | Golovko et al. | 428/195.1 |
| 2007/0237706 A1 * | 10/2007 | Black et al. | 423/447.3 |
| 2008/0108132 A1 * | 5/2008 | Ban et al. | 435/320.1 |
| 2008/0170982 A1 * | 7/2008 | Zhang et al. | 423/447.3 |
| 2009/0054674 A1 * | 2/2009 | Lukas et al. | 556/450 |
| 2010/0203295 A1 * | 8/2010 | Black et al. | 428/163 |
| 2010/0270536 A1 * | 10/2010 | Tombler, Jr. | 257/24 |
| 2010/0285656 A1 * | 11/2010 | Esconjauregui et al. | 438/478 |
| 2011/0101477 A1 * | 5/2011 | Pullini et al. | 257/421 |
| 2011/0281417 A1 * | 11/2011 | Gordon et al. | 438/424 |
| 2012/0040462 A1 * | 2/2012 | Baca et al. | 435/399 |

FOREIGN PATENT DOCUMENTS

| | | |
|---|---|---|
| JP | 11 017 217 | 1/1999 |
| JP | 2006-156646 | 6/2006 |

OTHER PUBLICATIONS

"Spin-on doping of porous silicon and its effect on photoluminescence and transport characteristics" Applied Physics Letters, AIP, American Institute of Physics, Melville, NY, US, vol. 70, No. 17, Apr. 28, 1997, pp. 2253-2255, XP012017698, ISSN : 0003-6951, p. 2253, left-hand column, line 27—p. 2254, left-hand column, paragraph 1.

T.P. Nguyen et al.: "Non-linear optical properties of poly(phenylene vinylene) in porous silicon substrates ", Physica Status Solici C, vol. 2, No. 9, 2005, pp. 3222-3226, XP009088962, 2 Experimental.

Raissi F et al.: "Highly sensitive near IR detectors using n-type porous Si" Sensors and Actuators A, Elsevier Sequoia S.A., Lausanne, CH, vol. 104, No. 2, Apr. 15, 2003, pp. 117-120, XP004417424, ISSN: 0924-4247, 2. Preparation of PtSi/porous Si detector.

* cited by examiner

METHOD FOR PRODUCING A SILICON SUBSTRATE HAVING MODIFIED SURFACE PROPERTIES AND A SILICON SUBSTRATE OF SAID TYPE

FIELD OF THE INVENTION

The present invention relates to a method for producing a silicon substrate, especially a silicon wafer, having modified material properties on the surface of the silicon substrate. The present invention also relates to a silicon substrate, especially a silicon wafer, that has been produced by the method according to the present invention.

BACKGROUND INFORMATION

Methods for producing silicon substrates are known from the related art in different developments. Material properties of silicon are generally brought about by diffusion of foreign atoms into the silicon, starting from the surface of the substrate. In this case, a doping substance is deposited on the substrate surface, for example, and is then thermally run into the silicon at very high temperature. This means that the doping substances are stimulated to diffuse into the silicon.

Furthermore, a method for doping a crystalline substrate is discussed in EP 0 750 058 B1, in which first of all a first layer is generated on the substrate which has defects. Subsequently, a second layer is applied on top of the first layer which is separate from the first layer. The second layer contains doping substance atoms which are stimulated to diffuse into the first defective layer, and to occupy the defects in the first layer. The second layer is then removed.

Such methods, however, have the disadvantage that the diffusion processes take place only very slowly, even at very high temperatures. That is why, using such methods, foreign atoms are only able to be inserted into the silicon at depths of at most 20 to 25 μm. Furthermore, there are also foreign atoms, such as antimony (Sb) or germanium (Ge), which diffuse only very slowly, because of their large atomic diameter. Consequently, a sufficient depth of diffusion cannot be achieved within economically justifiable times.

SUMMARY OF THE INVENTION

By contrast, the method according to the present invention, having the features described herein, has the advantage that it is possible to produce silicon materials having modified properties. The properties, in this context, are able to be modified in a targeted manner. In this connection, in particular, nanoparticles are inserted into the silicon substrate, according to the exemplary embodiments and/or exemplary methods of the present invention, the method according to the present invention being able to be carried out very economically and cost-effectively. This is accomplished by producing a porous silicon surface which has macropores having a diameter between 10 μm and 50 nm, or mesopores having a diameter between 50 nm and 2 nm, or nanopores having a diameter less than 2 μm.

Thereafter, a filling material that is to be inserted into the silicon surface is applied, and the filling material is filled into generated pores in the silicon surface. If necessary, superfluous filling material is removed from the silicon surface, and the silicon substrate, having the filling material in the pores of the silicon surface, is tempered at a temperature between ca. 1000° C. and 1400° C., in order to close again the pores generated in the silicon surface. The filling material is enclosed by silicon in the process. The Si-matrix created has monocrystalline properties in this instance, so that, if necessary, additional semiconductor processes are able to be carried out in it. The properties of the silicon surface may me modified, depending on which filling material has been selected. According to the exemplary embodiments and/or exemplary methods of the present invention, filling materials of every kind may be used in this context, particularly nanoparticles.

Other further developments of the exemplary embodiments and/or exemplary methods of the present invention are also described herein.

The filling of the filling materials into the pores of the silicon surface, in an exemplary manner, takes place by generating vibrations. This may be accomplished mechanically, for example, using a vibrating table or the like, or using ultrasound. The vibrations may be generated in two different direction, especially in two orthogonal directions. Alternatively, the filling of the pores of the silicon surface with the filling material may also be carried out using supercritical carbon dioxide or from a liquid phase, for instance, from a suspension or from an emulsion.

The silicon surface may also be produced using electrochemical anodizing. An especially cost-effective porous silicon surface may thereby be produced.

The tempering may take place in a hydrogen atmosphere.

In a further exemplary manner, the silicon surface is a monocrystalline silicon matrix. Nanoparticles, in particular, may hereby be inserted into the monocrystalline silicon matrix. Consequently, a monocrystalline silicon substrate having inclusions may be obtained hereby. All the advantages of a monocrystalline substrate may be obtained by this.

The filling material to be inserted may be carbon, especially in nanoparticle form, such as graphite, for example, or a carbon compound, such as hydrocarbons or other carbon compounds with hydrogen and/or other elements, such as oxygen, nitrogen, phosphorus or boron. The filling material may alternatively also be a high-molecular aromatic or aliphatic carbon compound. As the filling material, one may also use any desired combination of different materials.

The filling material to be inserted into the silicon surface may be a dopant for producing p-type or n-type silicon carbide (sic).

According to one further exemplary development of the present invention, the porosifying and filling of the porous silicon surface is limited to a certain local area. Because of this, in particular in situ p-doped or n-doped layers of silicon carbide may be produced. Also because of this, a silicon substrate may be produced which has two or more regions having different filling material.

The exemplary embodiments and/or exemplary methods of the present invention also relates to a silicon substrate, especially a silicon wafer, that may be produced by the method according to the present invention. In particular, a silicon wafer may be produced, in this context, which has light-emitting properties, to be used, for instance as an LED, a specific interference being produced of the band structure of the silicon. This may be achieved, for instance, by inserting rare-earth atoms, such as erbium in nanoparticle form into the porous silicon, and subsequently this is oxidized all the way through.

An exemplary embodiment of the present invention is described in detail below, with reference to the accompanying drawings.

DETAILED DESCRIPTION

A method for producing a silicon substrate 1 having a modified surface is described in detail below, with reference to FIGS. 1 through 5.

Figure 1:
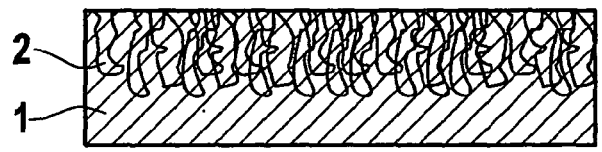
FIG. 1 shows sectional view(s) and/or various method step(s) of a method for producing a silicon substrate according to an exemplary embodiment of the present invention.
Figure 2:
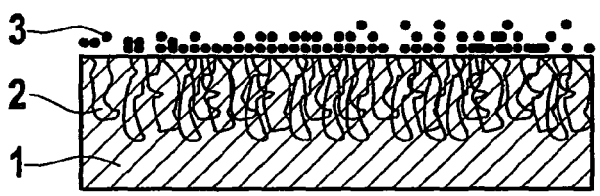
FIG. 2 shows another sectional view(s) and/or various method step(s) of a method for producing a silicon substrate according to an exemplary embodiment of the present invention.

Silicon substrate 1 of the exemplary embodiment is a silicon wafer. As shown in FIG. 1, a large number of pores 2 has been formed in silicon substrate 1 by porosification. Pores 2 have a different width and depth, and are developed as macropores, mesopores and nanopores. The diameters may be between a few µm (e.g. 35 µm) to 1 nm. The depth of pores 2 is between ca. 100 nm to ca. 200 µm. The diameter of a pore 2, in this context, is not necessarily constant over its depth. After the first step of providing the silicon substrate, pores 2 are produced, for instance, using electrochemical anodizing, so that the porous silicon surface is created.

Figure 3:
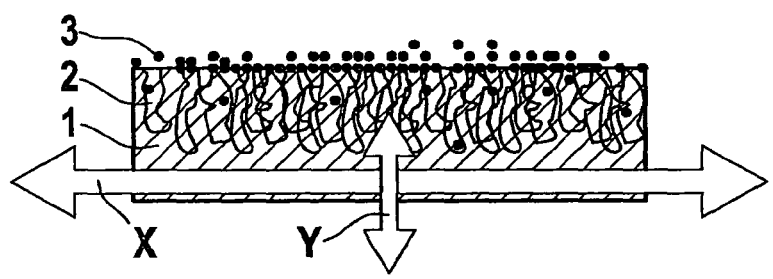
FIG. 3 shows another sectional view(s) and/or various method step(s) of a method for producing a silicon substrate according to an exemplary embodiment of the present invention.

In the next step, a filling material 3, that is to be inserted, is applied to the porous silicon surface. The filling material is developed in nanoparticle form, and may have a diameter that is a little smaller than the smallest generated diameter of pores 2. By double arrows X and Y, FIG. 3 schematically shows that by using mechanical vibrations, for instance, using a vibrating table or the like, loose filling materials 3 are inserted into pores 2. In this connection, a plurality of nanoparticles may be inserted into one pore. As shown in FIG. 3, the vibrating table executes a motion parallel to the longitudinal direction of pores 2 in the direction of double arrow Y, and a perpendicular motion to double arrow Y in the direction of double arrow X. It would also be conceivable that still another motion, perpendicular to the plane of the drawing, might be performed. The motions in the X and Y directions may be superposed, or carried out one after the other, or alternatingly.

Figure 4:
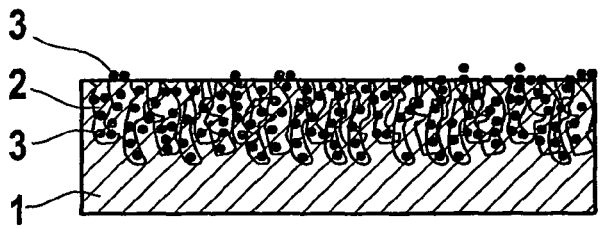
FIG. 4 shows another sectional view(s) and/or various method step(s) of a method for producing a silicon substrate according to an exemplary embodiment of the present invention.
Figure 5:
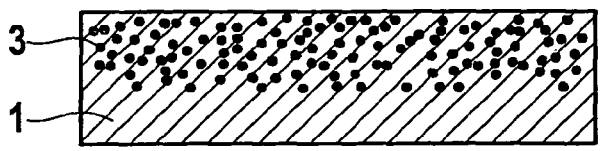
FIG. 5 shows another sectional view(s) and/or various method step(s) of a method for producing a silicon substrate according to an exemplary embodiment of the present invention.

FIG. 4 shows the state at which pores 2 had each been filled with a certain number of nanoparticles 3. The nanoparticles that are still located on the surface of silicon substrate 1 are removed. Subsequently, the silicon substrate provided with the nanoparticles is tempered at a temperature of ca. 1000° C. to ca. 1400° C. Thereby pores 2, generated in the silicon substrate, are closed again. The tempering may take place in an oven, especially under a hydrogen atmosphere. During the temperature treatment, pores 2 of the porous silicon surface are closed again, nanoparticles 3 located in pores 2 being enclosed. The state of silicon substrate 1 after tempering is shown in FIG. 5.

Consequently, it is possible, according to the exemplary embodiments and/or exemplary methods of the present invention, to produce a silicon substrate having one or even a plurality of various components which, under normal circumstances, would not be able to mingle with one another, or only at an uneconomical expenditure, and, in particular, nanoparticles are able to be inserted into a monocrystalline silicon matrix, so that a new class of materials can be produced. By the selection of the nanoparticles one is able to influence the properties of the silicon nanoparticle product in a specified manner.

Metallic nanoparticles and/or their oxides and/or their carbides and/or their nitrides may be used as the nanoparticles. As nanoparticles one may also use, for example, carbon for the production of silicon carbide and/or materials such as tantalum, tungsten, iridium, zirconium, rhenium, vanadium, molybdenum, niobium, hafnium, osmium, scandium, yttrium, lutetium, lawrencium, titanium, chromium, iron, ruthenium, rhodium as well as their nitrides and or carbides. One may also use rare-earth metal atoms, for instance, for the realization of electroluminescent silicon layers. For this, for example, all the elements of Main Group 3 of the periodic system, and particularly the lanthanoids (Ce to Lu) may be used.

The exemplary embodiments and/or exemplary methods of the present invention is particularly meaningful for the production of crystalline SiC layers, it being especially possible to produce monocrystalline SiC layers. Carbon C or a carbon carrier may be inserted, for instance, in the form of graphite or in the form of hydrocarbons or other carbon compounds with hydrogen and/or other elements, such as oxygen, nitrogen, phosphorus, boron, etc. One may also produce, in this manner, in situ p-doped or n-doped layers of SiC.

Carbon compounds dissolved in suitable solvents may also be inserted, and durably deposited in the pores of the porous silicon surface, for instance, by evaporation of the solvent.

In this way, for example, C60 particles or carbon nanotubes or compounds of such particles or tubes with hydrogen dissolved in benzene may be deposited in pores 2 of the porous silicon substrate. Similarly, high-molecular aromatic or aliphatic carbon compounds, such as tar-like compounds, may be used as starting materials which, at high temperatures, have such a low vapor pressure that they are not able, or not substantially able to vaporize out of the nanostructure during subsequent high temperature treatment, and as a result, they react with the surrounding silicon of the nanostructure. As the filler material one may also use nitrogen-carbon compounds, so-called nitrile-type compounds, or cyanide (CN) or cyanamide ($CN_2$), in the case of these compounds, at a high temperature treatment, the rupturing of the CN bonds taking place. Whereas the carbon thus set free continues to react with the surrounding silicon, the volatile nitrogen, likewise set free, is able to leave the nanostructure again, still largely unreacted. Thereafter, silicon substrate 1 is tempered by temperature treatment, in order to close pores 2 of the porous silicon surface.

Consequently, according to the exemplary embodiments and/or exemplary methods of the present invention, a type of solid emulsion may be created, whose mixing ratio is defined by the pore size, the pore type and the pore separation distance, as well as the particle size and the quantity of the filling material. Depending on whether the porous silicon substrate was produced of polycrystalline or monocrystalline silicon, it may be determined by a suitable parameter selection, according to the exemplary embodiments and/or exemplary methods of the present invention, whether the particles inserted into the porous silicon surface are enclosed by the rearrangement of polycrystalline or monocrystalline silicon. In this way, materials are able to be combined with one another which are otherwise only able to be mixed with one another with the greatest difficulty.

Thus, according to the exemplary embodiments and/or exemplary methods of the present invention, one may achieve a monocrystalline silicon layer close to the surface which, in a certain proportion, contains the inserted filling material, which is not possible using other methods, or at least not so cost-effectively. Consequently, using the exemplary embodiments and/or exemplary methods of the present invention, one is able to produce crystalline or amorphous silicon carbide, for example. It should be noted that the property of the material produced is able to be strongly influenced by the intercalated nanoparticles. This makes it possible, for example, to provide chemically and/or mechanically highly resistant surfaces. Furthermore, additional doping substances may also be inserted, in order to produce, for instance, in situ p-type or n-type silicon carbide.

Another use of the method according to the present invention is also, for example, the production of light-emitting silicon for use as an LED, for instance, by the targeted interference in the band structure in the silicon. This may be done, for instance, by inserting rare-earth atoms, such as erbium, in nanoparticle form into porous silicon substrate 1 and then oxidizing it all the way through. Thus, the method makes possible the production of new materials based on a silicon substrate by porosifying and filling up with one or more different materials, which may be of a nanoparticle size. The nanoparticles inserted into the pores are enclosed by subsequent tempering. Thus, the new type of silicon substrate has different properties that are dependent on the inserted particles. The insertion of various particles may also, for instance, be limited locally on the silicon surface, in order to produce several different areas having different properties on the silicon surface, for instance.

What is claimed is:

1. A silicon substrate device, comprising:
    a silicon substrate having an essentially planar silicon surface in which there are a plurality of cavities of a diameter of between less than 0.002 µm and 10 µm; and
    a filling material within the cavities and selected from a group of rare earths, wherein the cavities, including the filling material therein, are enclosed on all sides by the silicon substrate.

2. The silicon substrate device of claim 1, wherein the filling material includes a chemical element in a lanthanide series.

3. The silicon substrate device of claim 2, wherein the filling material is erbium.

4. The silicon substrate device of claim 3, wherein the erbium is oxidized.

5. A silicon wafer, comprising:
    a silicon substrate having an essentially planar surface in which there are a plurality of cavities of a diameter of between less than 0.002 µm and 10 µm; and
    a filling material within the cavities and selected from a group of rare earths, wherein the cavities, including the filling material therein, are enclosed on all sides by the silicon substrate.

* * * * *

UNITED STATES PATENT AND TRADEMARK OFFICE
CERTIFICATE OF CORRECTION

PATENT NO. : 8,492,850 B2  Page 1 of 1
APPLICATION NO. : 12/308200
DATED : July 23, 2013
INVENTOR(S) : Lammel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 960 days.

Signed and Sealed this
Eighth Day of September, 2015

Michelle K. Lee
*Director of the United States Patent and Trademark Office*